US012546008B2

(12) United States Patent
Falcone et al.

(10) Patent No.: US 12,546,008 B2
(45) Date of Patent: Feb. 10, 2026

(54) PROCESS CHAMBER VOLUME ADJUSTMENT

(71) Applicant: ASM IP Holding B.V., Almere (NL)

(72) Inventors: Christopher Falcone, Chandler, AZ (US); Dinkar Nandwana, Chandler, AZ (US); Kyle Fondurulia, Phoenix, AZ (US); Vishnu Shakti, Bangalore (IN)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/395,006

(22) Filed: Dec. 22, 2023

(65) Prior Publication Data

US 2024/0218514 A1 Jul. 4, 2024

Related U.S. Application Data

(60) Provisional application No. 63/435,750, filed on Dec. 28, 2022.

(51) Int. Cl.

*C23C 16/52* (2006.01)
*C23C 16/455* (2006.01)
*C23C 16/458* (2006.01)

(52) U.S. Cl.

CPC ........ *C23C 16/52* (2013.01); *C23C 16/45565* (2013.01); *C23C 16/45589* (2013.01); *C23C 16/4583* (2013.01)

(58) Field of Classification Search

None

See application file for complete search history.

(56) References Cited

U.S. PATENT DOCUMENTS

| | | | | |
|---|---|---|---|---|
| 6,363,624 | B1 | 4/2002 | Pang | |
| 7,374,620 | B2 | 5/2008 | Ohmi | |
| 2012/0040084 | A1* | 2/2012 | Fairbourn | C23C 16/46 118/724 |
| 2017/0207078 | A1 | 7/2017 | Chou | |
| 2022/0310383 | A1* | 9/2022 | Hirose | H01L 21/67103 |
| 2023/0260759 | A1* | 8/2023 | Hudson | C23C 16/50 427/534 |

* cited by examiner

*Primary Examiner* — Shamim Ahmed
*Assistant Examiner* — Bradford M Gates
(74) *Attorney, Agent, or Firm* — Banner & Witcoff, Ltd.

(57) ABSTRACT

Methods and apparatuses for adjusting a process chamber volume are described. For example, a process chamber, after removing at least a component used to perform a function associated with the process chamber, may be installed with a fixture to adjust a volume of the process chamber. The process chamber with the fixture may reduce the amount of precursor gases and processing time for coating a workpiece. The workpiece, after the coating, may be placed in another process chamber to perform a function associated with the other process chamber.

16 Claims, 11 Drawing Sheets

PROCESS CHAMBER VOLUME ADJUSTMENT

CROSS-REFERENCE TO RELATED APPLICATION(S)

This application claims the benefit of U.S. Provisional Application 63/435,750 filed on Dec. 28, 2022, the entire contents of which are incorporated herein by reference.

TECHNICAL FIELD

The present disclosure generally relates to an apparatus and a method for manufacturing semiconductor processing devices.

BACKGROUND

Semiconductor devices are manufactured in process chambers. Over time, those process chambers become obsolete or are less efficient than newer process chambers. Because of the high cost of new process chambers, companies are reluctant to expend capital to gain only a small improvement in efficiency. In some situations, only a workpiece inside the process chamber may need reconditioning. Maintaining or refurbishing the workpiece (e.g., a heater, a stem, a showerhead, etc.) may involve periodically coating the workpiece to address particulate contamination and limit introduction of defects to processed semiconductor substrates. The periodic coating of the workpiece may take extra resources (e.g., precursor gases, coating process time, a process chamber for coating, etc.) and may compete with processing of work in progress (e.g., contemporaneous processing of semiconductor substrates), reducing the throughput of the process chamber and thereby increasing the costs associated with the processing of the semiconductor substrates.

SUMMARY

The following summary presents a simplified summary of certain features. The summary is not an extensive overview and is not intended to identify key or critical elements.

Methods and apparatuses are described for adjusting a process chamber volume. In one aspect, a method may comprise removing, from a process chamber comprising internal walls and at least one component, wherein the internal walls define a first volume, the at least one component, installing, in the process chamber, a fixture, wherein the fixture and at least some of the internal walls define a second volume, wherein the second volume may be smaller than the first volume, inserting, into the process chamber with the second volume, a workpiece, flowing, across the workpiece, a precursor gas, coating the workpiece as a coated workpiece, and removing the coated workpiece from the process chamber with the second volume.

In another aspect, a method may comprise removing, from a process chamber comprising internal walls and at least one component, wherein the internal walls define a first volume, the at least one component; installing, in the process chamber, a fixture, wherein the fixture and at least some of the internal walls divide the first volume into a plurality of second volumes, wherein one of the plurality of second volumes may be smaller than a sum of remaining ones of the plurality of second volumes; performing a coating process using the one of the plurality of second volumes; and removing a product of the coating process from the process chamber.

In a further aspect, the method may further comprise installing, in a second process chamber for processing semiconductor substrates, the coated workpiece; and performing at least one semiconductor processing step on the semiconductor substrates, wherein the coated workpiece, installed in the second process chamber, is configured to perform a function associated with the at least one semiconductor processing step.

In a further aspect, the removing the at least one component comprises removing, from the process chamber, at least one of: a substrate support and a shaft, or a lift pin configured to lift the substrate support.

In a further aspect, the coating comprises coating, in the process chamber with the second volume: a heater, a showerhead, a pneumatic valve manifold (PVM), or a gas channel plate (GCP).

In a further aspect, the inserting comprises seating the workpiece in the process chamber with the second volume, wherein at least a part of the workpiece is processed in the second volume, and the flowing comprises flowing the precursor gas through the process chamber with the second volume, bounded by the fixture and the at least some of the internal walls.

In a further aspect, the installing comprises sealing the fixture to restrict the precursor gas from flowing into a portion of the first volume not contained in the second volume.

In a further aspect, the process chamber comprises an inside wall having a first circumference and a gate valve, in the inside wall, configured to permit passage of an object, and the installing the fixture comprises: seating, in the process chamber, a first annulus of the fixture, wherein the first annulus, with a second circumference extends along the inside wall, wherein the gate valve is blocked by the first annulus; installing, onto the first annulus, a bottom plate; and seating, in the first annulus and above the bottom plate, a second annulus.

In a further aspect, the process chamber comprises an inside wall having a first circumference and a gate valve, in the inside wall, configured to permit passage of an object, the fixture comprises an annulus having a second circumference, a center, at least one tab, at least one rivet attaching the at least one tab to the annulus, and a bottom plate, wherein a location of the at least one tab is based on dimensions of the workpiece, and the installing the fixture comprises: seating, in the process chamber, the annulus, wherein the annulus extends along the inside wall; and seating a bottom plate of the fixture on the at least one tab, fixed to the annulus, by pressing the bottom plate downward against the at least one tab, wherein the at least one tab passes through at least a corresponding hole of the bottom plate.

In a further aspect, the seating the bottom plate comprises seating the bottom plate on the at least one tab, each tab comprising metal and comprising at least four segments, and the at least four segments comprise: a first segment configured to be fastened, by a rivet, to the inside wall of the annulus; a second segment angled relative to the first segment and extending inwardly to the center of the annulus; a third segment angled relative to the second segment and extending inwardly toward the center of the annulus; and a fourth segment angled relative to the third segment and extending outwardly away from the center of the annulus, wherein a length of the fourth segment is more than twice of a length of the third segment.

In a further aspect, the seating the bottom plate comprises seating the bottom plate on at least two different types of tabs, a first type tab of the at least two different types of tabs is configured to fasten, by a first mechanism, the bottom plate to the first type tab, a second type tab of the at least two different types of tabs is configured to fasten, by a second mechanism, the bottom plate to the second type tab, and removal of the bottom plate, fastened by the second mechanism, from the second type tab is easier than removal of the bottom plate, fastened by the first mechanism, from the first type tab.

In a further aspect, a method may comprise removing, from a process chamber comprising internal walls and at least one component, wherein the internal walls define a first volume, the at least one component; installing, in the process chamber, a fixture, wherein the fixture and at least some of the internal walls divide the first volume into a plurality of second volumes, wherein one of the plurality of second volumes is smaller than a sum of remaining ones of the plurality of second volumes; performing a coating process using the one of the plurality of second volumes; and removing a product of the coating process from the process chamber.

In a further aspect, the method may further comprise installing the product of the coating process in another process chamber configured to operate with the product.

In a further aspect, the product comprises a heater plate and a heater stem configured to support the heater plate, a tabbed annulus of the fixture, surrounded by an inside wall of the process chamber, extends circumferentially around the heater stem, a flanged annulus of the fixture, partially surrounded by an inside wall of the tabbed annulus, and extends circumferentially around a part of the heater stem and a part of the heater plate, and the installing the fixture comprises: seating the tabbed annulus in the process chamber; seating a bottom plate of the fixture on at least one tab extending radially inward from the tabbed annulus, wherein a center aperture of the bottom plate is registered with the heater stem; and seating the flanged annulus in the tabbed annulus.

In a further aspect, the performing the coating process comprises: flowing at least a coating precursor gas into the one of the plurality of second volumes; and coating, based on the at least the coating precursor gas, the heater plate and at least a part of the heater stem.

In a further aspect, the at least one tab is configured to clip into a hole of the bottom plate, the seating the bottom plate comprises fastening the bottom plate to four tabs, and each of the four tabs through a corresponding hole of the bottom plate, the fastening being easier than unfastening the bottom plate from the four tabs.

In a further aspect, the seating the bottom plate comprises adjusting, based on a length of a heater stem of the product, positions of the at least one tab.

In a further aspect, an apparatus may comprise a reaction chamber configured to flow precursor gasses through a volume of the reaction chamber; wherein the volume of the reaction chamber may be defined by inner walls of the reaction chamber, a bottom plate; a tabbed annulus configured to support the bottom plate, wherein the tabbed annulus extends circumferentially around the bottom plate. The tabbed annulus may comprise a center; a cylindrical wall; and at least one tab extending radially inward from the cylindrical wall; and a flanged annulus configured to be juxtaposed to the tabbed annulus and above the bottom plate. A part of the flanged annulus may be surrounded by an inside surface of the cylindrical wall of the tabbed annulus. The bottom plate may be configured to separate the volume into: a coating volume (defined by the flanged annulus, a first portion of the tabbed annulus, the bottom plate, and first inner walls of the reaction chamber) and a dead volume (sealed from a flow of the precursor gasses). The dead volume may be defined by the bottom plate, a second portion of the tabbed annulus, and second inner walls of the reaction chamber.

In a further aspect, the bottom plate comprises a center aperture configured to be registered with a stem of a workpiece, and the stem is configured to support the workpiece.

In a further aspect, the at least one tab comprising metal and comprising at least four segments, the at least four segments comprise: a first segment configured to be fastened, by a rivet, to the cylindrical wall of the tabbed annulus; a second segment angled relative to the first segment and extending inwardly from the cylindrical wall; a third segment angled relative to the second segment and extending inwardly from the cylindrical wall; and a fourth segment angled relative to the third segment and extending outwardly away from the center of the tabbed annulus, wherein a length of the fourth segment is more than twice of a length of the third segment.

In a further aspect, the third segment is angled 60° degrees clockwise relative to the bottom plate and the fourth segment is angled 135° degrees counter-clockwise relative to the third segment.

Additional aspects, configurations, embodiments, and examples are described in more detail below.

BRIEF DESCRIPTION OF DRAWINGS

Some features are shown by way of example, and not by limitation, in the accompanying drawings. In the drawings, like numerals reference similar elements.

Figure 1:
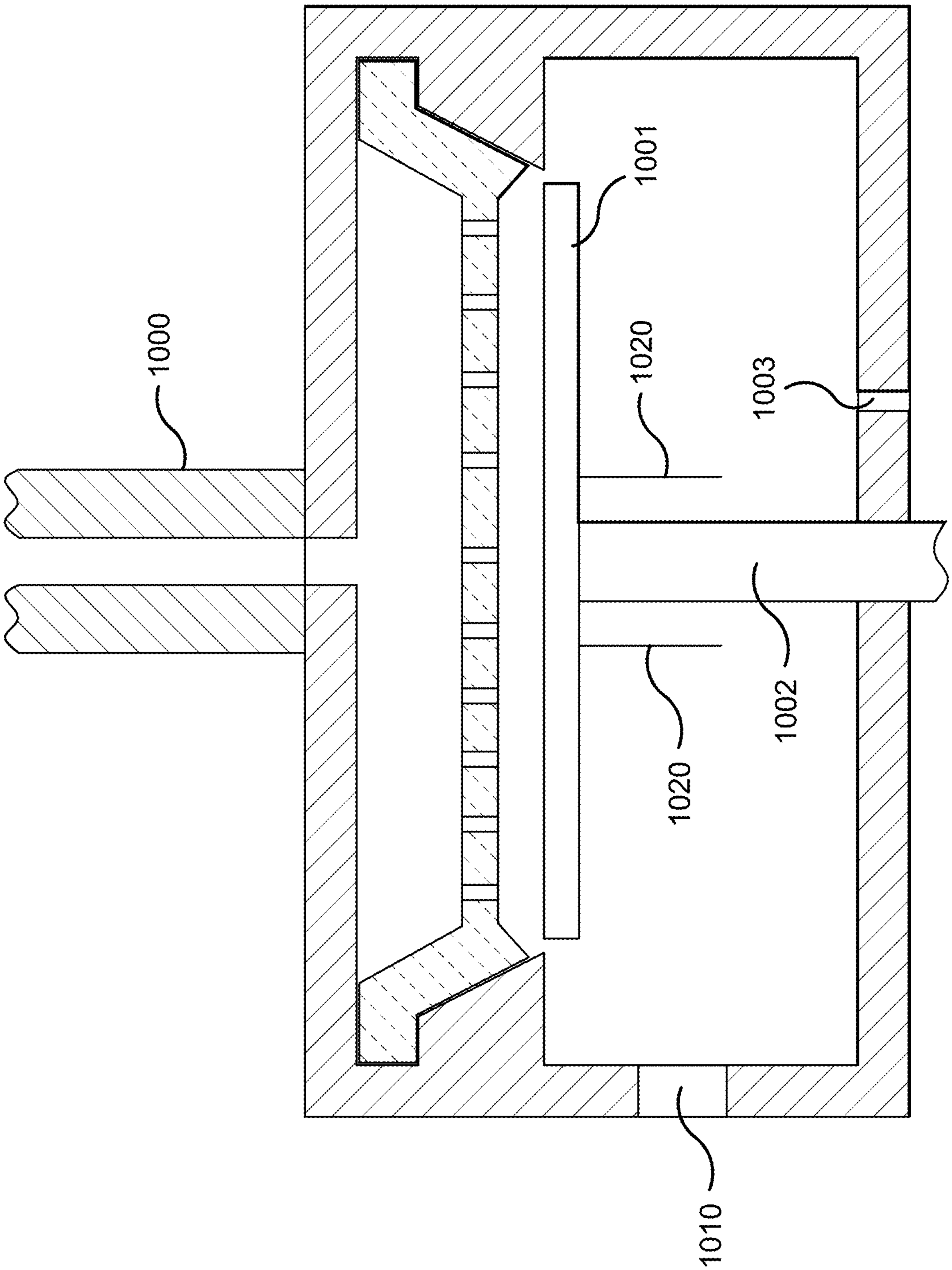
FIG. 1 shows an example of a cross-sectional view of a process chamber.

It will be recognized by the skilled person in the art, given the benefit of this disclosure, that the exact arrangement, sizes and positioning of the components in the figures is not necessarily to scale or required.

DETAILED DESCRIPTION

One or more aspects of the disclosure relate to adjusting a volume of a process chamber that may be used to process semiconductor substrates and/or other substrates. A substrate may include a wafer such as a wafer having a pattern. As used herein, the term substrate may refer to any underlying material or materials upon which a layer may be deposited. A substrate may include a bulk material, such as silicon (e.g., single-crystal silicon) or other semiconductor material, and may include one or more layers, such as native oxides or other layers, overlying or underlying the bulk material. Further, the substrate may include various topologies, such as recesses, lines, and the like formed within or on at least a portion of a layer and/or bulk material of the substrate. By way of particular examples, a substrate may comprise one or more materials including, but not limited to, silicon (Si), germanium (Ge), germanium tin (GeSn), silicon germanium (SiGe), silicon germanium tin (SiGeSn), silicon carbide (SiC), or a group III-V semiconductor material, such as, for example, gallium arsenide (GaAs), gallium phosphide (GaP), or gallium nitride (GaN). In some embodiments, the substrate may comprise one or more dielectric materials including, but not limited to, oxides, nitrides, or oxynitrides. For example, the substrate may comprise a silicon oxide (e.g., $SiO_2$), a metal oxide (e.g., $Al_2O_3$), a silicon nitride (e.g., $Si_3N_4$), or a silicon oxynitride. In some embodiments of the disclosure, the substrate may comprise an engineered substrate wherein a surface semiconductor layer is disposed over a bulk support with an intervening buried oxide (BOX) disposed therebetween. The substrate may contain monocrystalline surfaces and/or one or more secondary surfaces that may comprise a non-monocrystalline surface, such as a polycrystalline surface and/or an amorphous surface. The substrate may include a layer comprising a metal, such as copper, cobalt, and the like.

The terms precursor gas and/or precursor gasses may refer to a gas or combination of gasses that participate in a chemical reaction that produces another compound. For example, precursor gasses may be used to grow an epitaxial layer comprising silicon carbide. Precursor gasses may include a deposition gas or gasses, a dopant gas or gasses, or a combination of a deposition gas or gasses and a dopant gas or gasses.

In the following description of the various embodiments, reference is made to the accompanying drawings, which form a part hereof, and in which is shown by way of illustration various embodiments in which aspects of the disclosure may be practiced. It is to be understood that other embodiments may be utilized and structural and functional modifications may be made without departing from the scope of the present disclosure. Aspects of the disclosure are capable of other embodiments and of being practiced or being carried out in various ways. Also, it is to be understood that the phraseology and terminology used herein are for the purpose of description and should not be regarded as limiting. Rather, the phrases and terms used herein are to be given their broadest interpretation and meaning. The use of "including" and "comprising" and variations thereof is meant to encompass the items listed thereafter and equivalents thereof as well as additional items and equivalents thereof. While various directional arrows are shown in the figures of this disclosure, the directional arrows are not intended to be limiting to the extent that bi-directional communications are excluded. Rather, the directional arrows are to show a general flow of steps and not the unidirectional movement of information. In the entire specification, when an element is referred to as "comprising" or "including" another element, the element should not be understood as excluding other elements so long as there is no special conflicting description, and the element may include at least one other element. Throughout the specification, expression "at least one of a, b, and c" may include 'a only', 'b only', 'c only', 'a and b', 'a and c', 'b and c', and/or 'all of a, b, and c'.

FIG. 1 shows an example of a cross-sectional view of a process chamber. A process chamber 1000 may include a substrate support 1001, a stem 1002, and lift pins 1020. For example, the substrate support 1001 may be a heater (e.g., resistive heater, ceramic heater) for heating a substrate (e.g., a semiconductor wafer). For purposes herein, the substrate support 1001 is referred to as a heater 1001. For example, the stem 1002 and the heater 1001 may monolithically form a substrate support, which may be an electrostatic chuck (ESC). The heater 1001 may be lowered to a point that the lift pins 1020 touch and/or engage into a base 1003. Once lowered, a semiconductor substrate may be carried into or out of the process chamber 1000 via a gate valve 1010, for example, using an end effector and a wafer transfer robot.

The heater 1001 may be used for supporting or heating a substrate during deposition of material layers onto the substrate, such as deposition of molybdenum-containing material layers onto the substrate. The heater 1001 may resistively heat the substrate to a desired deposition temperature, for example, between about 200 degrees Celsius and 400 degrees Celsius. The heater 1001 may be formed from a metallic material, such Hastelloy, which exhibits a corrosion resistance.

The heater 1001 and/or the stem 1002 may be periodically coated in-situ (e.g., coated while in the process chamber 1000) (referred to as "in-situ coating") to fix particulate contamination and may limit introduction of defects into the material layers being deposited onto the substrate. The process chamber 1000 may be provisioned with a precursor gas for the in-situ coating. During in-situ coating, the flow rate of the precursor gas may be limited or reduced. Further, the precursor gas used for standard deposition processes may be prevented from flowing and another precursor gas used for the in-situ coating process. Performing in-situ coating in a process chamber regularly processing semiconductor substrates increases the time when the process chamber is not used for processing those substrates, thereby decreasing throughput of the process chamber and increasing the effective cost of each semiconductor wafer. Moreover, at relatively high material layer deposition temperatures (e.g., greater than 400 degrees Celsius), the stem 1002 itself may become a source of contaminate because the relatively high material layer deposition temperatures may mobilize trace constituents of the Hastelloy forming the heater 1001. Further, the in-situ coating may compete with processing of work (e.g., semiconductor substrates) in progress, reducing the throughput of the process chamber 1000.

Additionally or alternatively, the heater 1001 or the stem 1002 may be periodically coated ex-situ (e.g., coated while in another process chamber 2000 of FIG. 2) (referred to as "ex-situ coating"). The ex-situ coating may use the other process chamber 2000 (e.g., a new process chamber from a third-party vendor, a refurbished process chamber, etc.) to coat the heater 1001 and/or the stem 1002. Using the other process chamber 2000 for the ex-situ coating may increase the cost and time. Using the other process chamber 2000 may also increase stresses to resins, epoxies, and/or electrical connectors associated with a workpiece to be coated. To reduce those stresses, a temperature for the ex-situ coating may be limited to be less than 200 degrees Celsius. For example, the other process chamber 2000 may not have been configured (e.g., a size of chamber volume being too large) for coating a given heater or stem, and may take an increased amount of a precursor gas and increased amount of processing time (e.g., 38 hours) longer than a target processing time (e.g., 24 hours).

Figure 2:
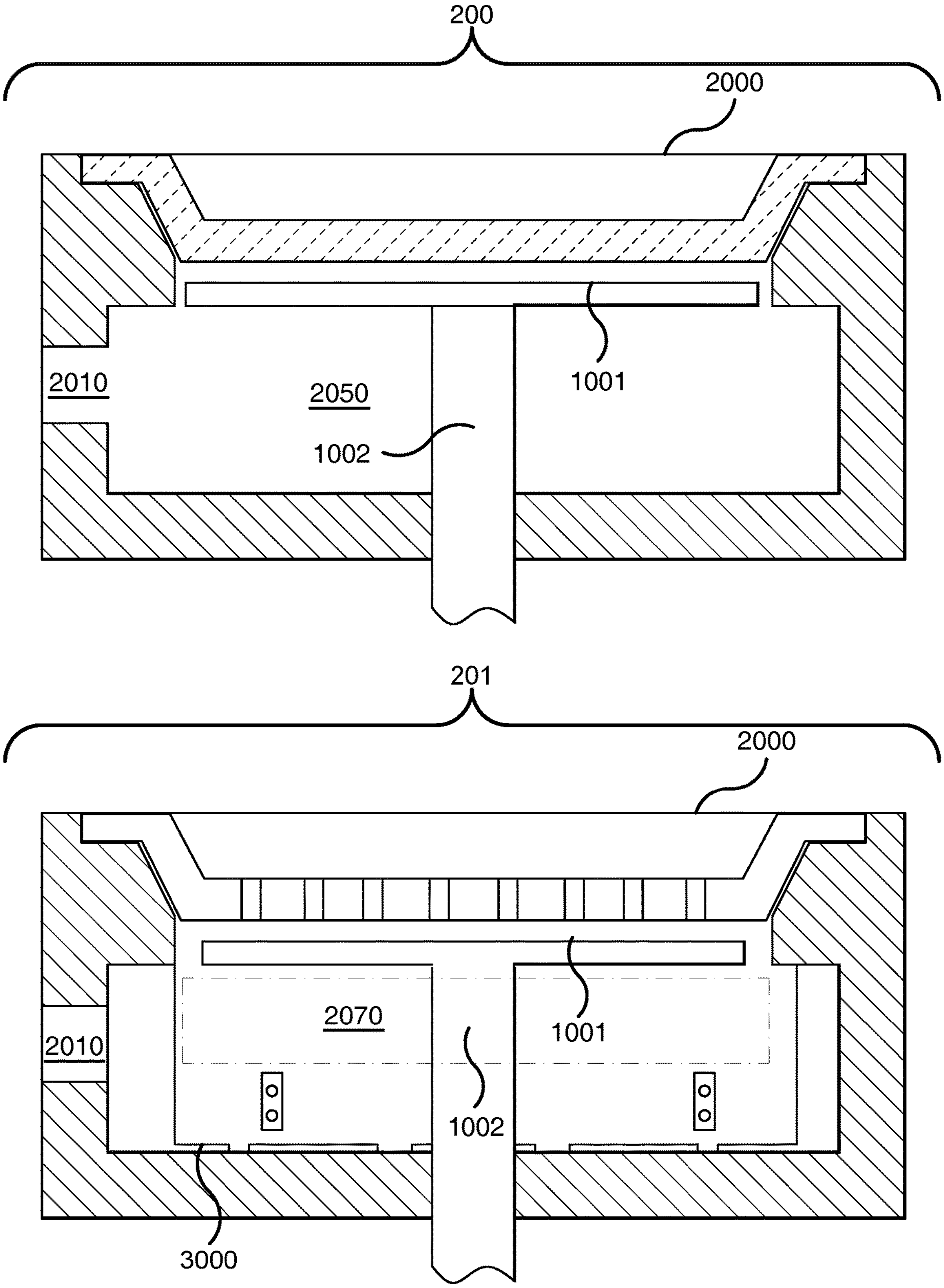
FIG. 2 shows a process chamber.

FIG. 2 shows the process chamber 2000 in an initial state 200 and in a later state 201. The process chamber 2000, with the configuration of the initial state 200, may initially have components (e.g., a pedestal, a ring, a shaft, etc.). The components may be removed from the process chamber 2000 and the process chamber 2000 may be repurposed for ex-situ coating. A workpiece, for example, the heater 1001 and the stem 1002 temporarily removed from the process chamber 1000 and placed in the process chamber 2000, may be coated ex-situ. The process chamber 2000 may have a gate valve 2010 and the volume 2050 (e.g., a cavity) formed by inside walls of the process chamber 2000. In the later state 201, the process chamber 2000 may include a fixture 3000 that reduces the volume (from the volume 2050 to a volume 2070) of the process chamber 2000. Without the fixture 3000, the volume 2050 of the process chamber 2000, in the initial state 200, may be substantially larger (e.g., approximately 2.9 times larger) than the volume 2070 of the process chamber 2000, in the later state 201, with the fixture 3000. This volume reduction may be beneficial as the reduction in volume reduces a time associated with performing a process. For instance, an ex-situ coating process performed by the process chamber 2000, in the initial state 200, without the fixture 3000 may take substantially longer time (e.g., 38 hours) than performing the ex-situ coating process using the process chamber 2000, in the later state 201, with the fixture 3000 (e.g., 24 hours) because the volume 2070 permits a higher quantity of the precursor gas to contact a workpiece being coated.

Figure 3A:
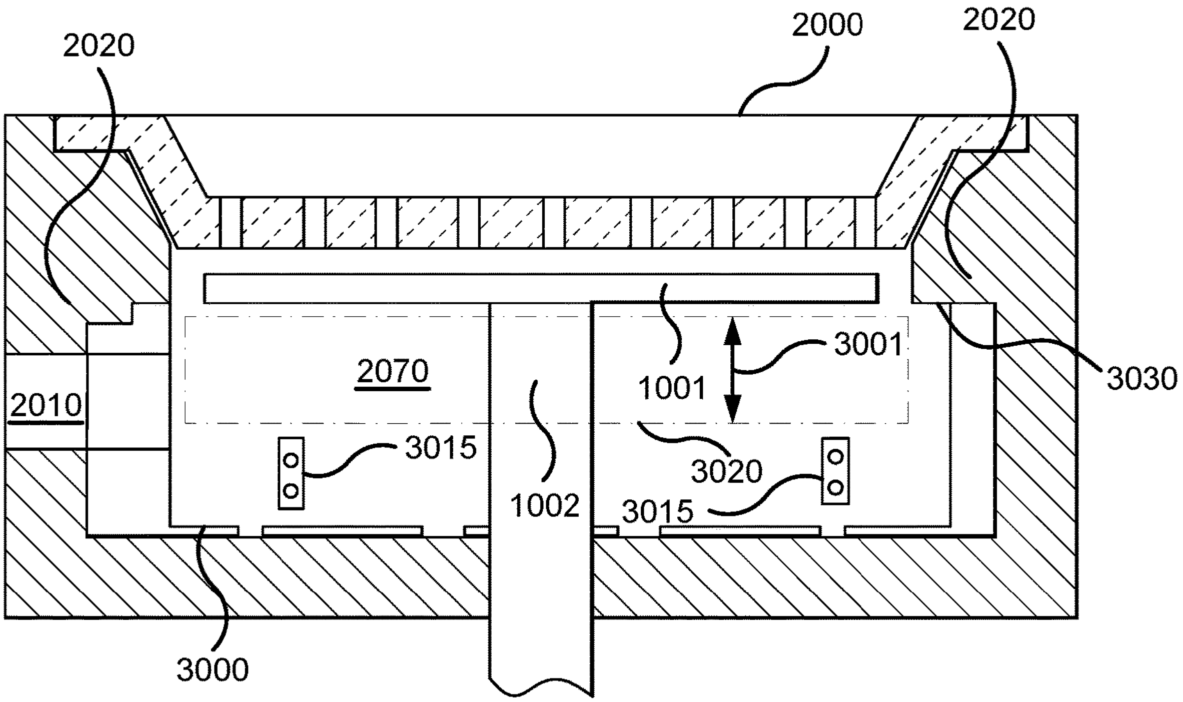
FIG. 3A shows a first view of the process chamber with a fixture.

FIG. 3A shows the process chamber 2000 with the fixture 3000. The fixture 3000 is shown separately in FIG. 3B. In FIG. 3A, the fixture 3000 has been installed in the process chamber 2000. The volume 2070 of the process chamber 2000 of FIG. 3A is smaller than the volume (e.g., the volume 2050 of FIG. 2) of a process chamber without the fixture 3000. For example, the volume 2070 may be approximate 2.9 times smaller than the volume 2050 of the process chamber 2000, in the initial state 200, of FIG. 2. The fixture 3000 may comprise a first annulus 3010 and a second annulus 3030. The second annulus may include a folded flange 3030A. The folded flange 3030A of the second annulus 3030 may be configured to hang over an edge of a top of a circumferential wall 2020 of the process chamber 2000. Also, the fixture 3000, as shown in FIG. 3A blocks the gate valve 2010. Blocking the gate valve 2010, helps reduce and/or prevent the precursor gas from leaking from the volume 2070. A vertical separation between the top of the second annulus 3030 and the bottom plate 3020 is shown by as length 3001. The fixture 3000 may include tabs 3015 that help support the bottom plate 3020.

A workpiece (e.g., the heater 1001 and the stem 1002, a showerhead, a pneumatic valve manifold (PVM), or a gas channel plate (GCP), etc.) may be placed in the process chamber 2000 with the fixture 3000 for ex-situ coating. The ex-situ coating performed by the process chamber 2000 with the fixture 3000 may take substantially shorter time (e.g., 24 hours) than the process chamber 2000 without the fixture 3000 (e.g., 38 hours) because of the volume 2070 that is smaller than the volume 2050. The volume 2070 may be a subspace of the volume 2050 and sealed (e.g., using a labyrinth seal) to restrict the precursor gas from flowing out of the volume 2070. Thus, the precursor gas may be prevented from flowing into the rest (e.g., a dead volume) of the volume 2050, except the subspace. The amount of the precursor gas for the ex-situ coating may, based on the dead volume, be reduced (e.g., by one third), and the ex-situ coating may take a less amount time (e.g., 24 hours instead of 38 hours).

Alternatively, the dead volume may remain fluidly coupled to a process space, for example, the volume 2050. For example, the fixture 3000 may be installed without using a gasket or a labyrinth seal. This alternative may simplify assembly of the fixture 3000 with the process chamber 2000 without causing deviation in coating on the workpiece (e.g., a heater and a stem).

Figure 3B:
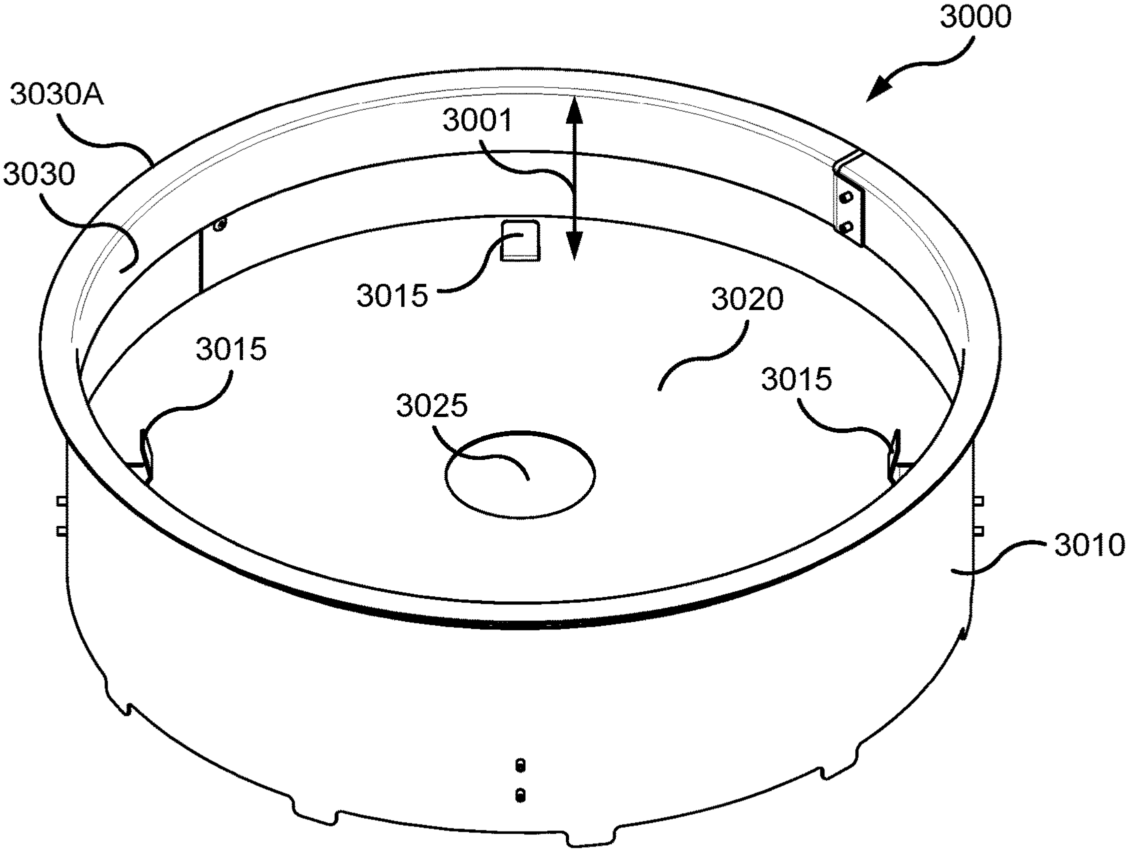
FIG. 3B shows the fixture.

FIG. 3B shows an example of the fixture 3000. The fixture may include the first annulus 3010 with the tabs 3015 (e.g., three or four uniform tabs spaced evenly), the bottom plate 3020 with a center aperture 3025, and the second annulus 3030 with the folded flange 3030A. The fixture 3000 may be made of 316 stainless steel or 304 stainless steel. As shown in FIG. 3A, a vertical separation between the top of the second annulus 3030 and the bottom plate 3020 is shown by as length 3001.

Figure 4A:
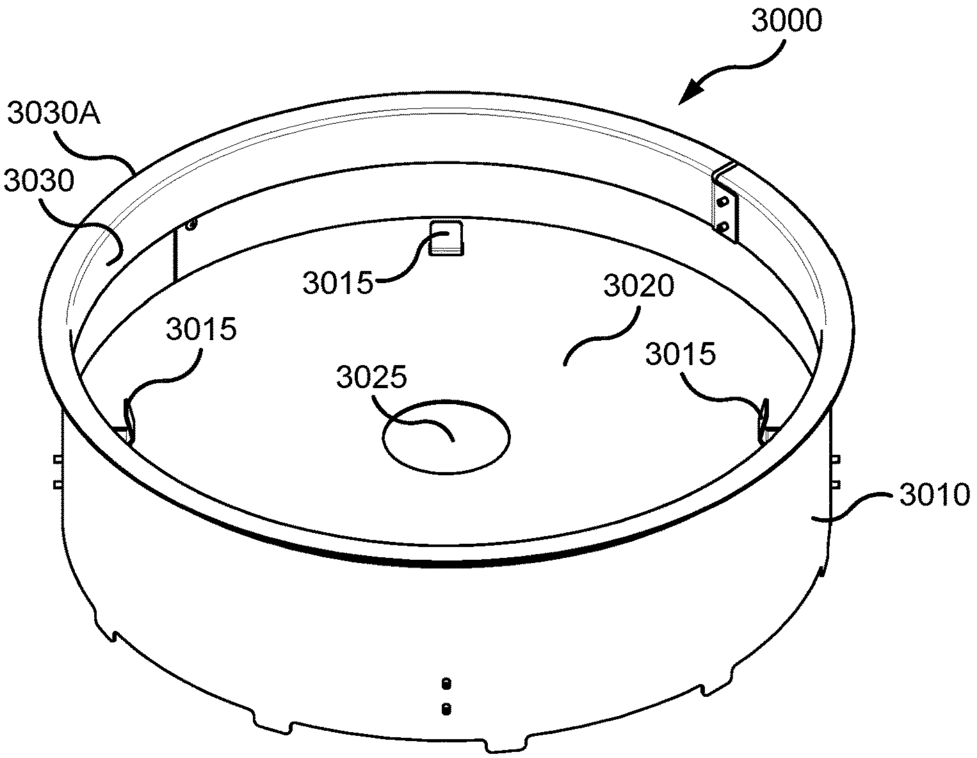
FIG. 4A shows an example of a fixture in a perspective view.

FIGS. 4A, 4B, 5, and 6 show examples of a fixture and/or portions of a fixture. FIG. 4A shows an example of the fixture 3000 in a perspective view. The fixture 3000 of FIG. 4A may comprise the first annulus 3010 with the tabs 3015, the bottom plate 3020 with the center aperture 3025, and the second annulus 3030 with the folded flange 3030A.

Figure 4B:
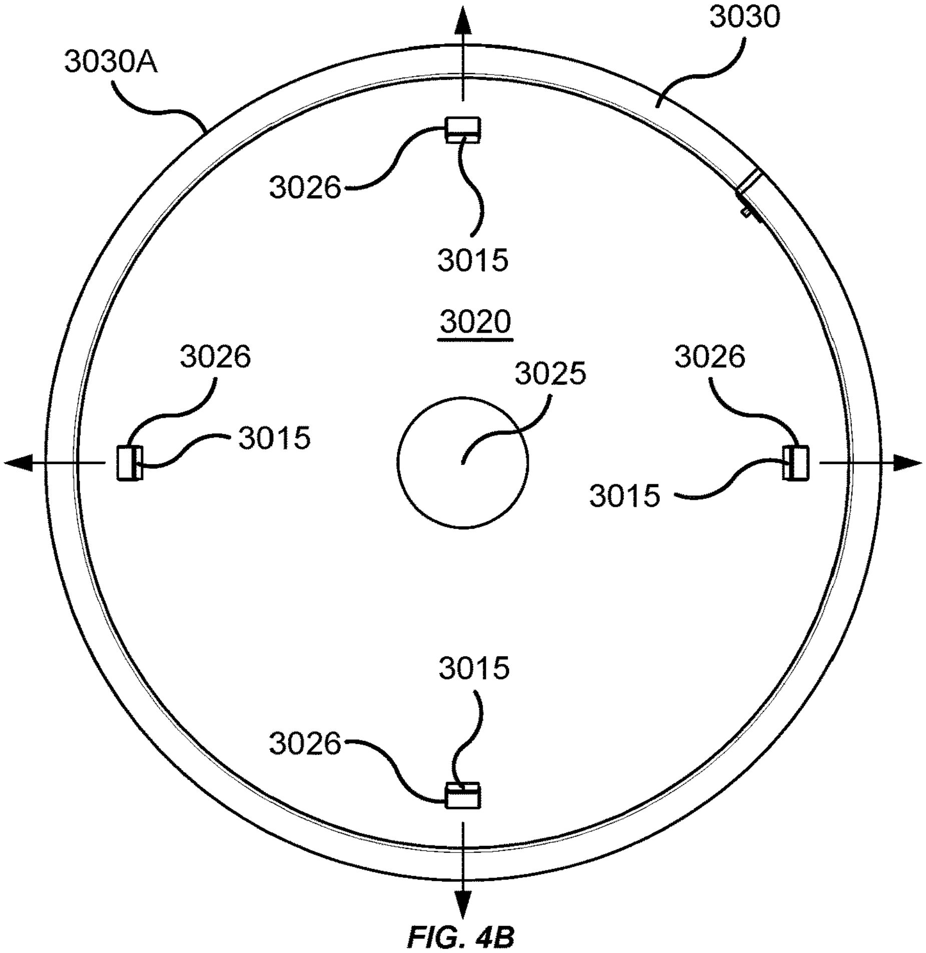
FIG. 4B shows an example of the fixture in a plan view.

FIG. 4B shows an example of the fixture 3000 in a top view. FIG. 4B shows the fixture 3000 with the first annulus 3010 with the tabs 3015, the bottom plate 3020 with the center aperture 3025 and a plurality of holes 3026, and the second annulus 3030 with the folded flange 3030A. The tabs 3015 may be biased in the direction of the arrows to exert at least a horizontal force on sides of corresponding holes in the bottom plate 3020.

Figure 5:
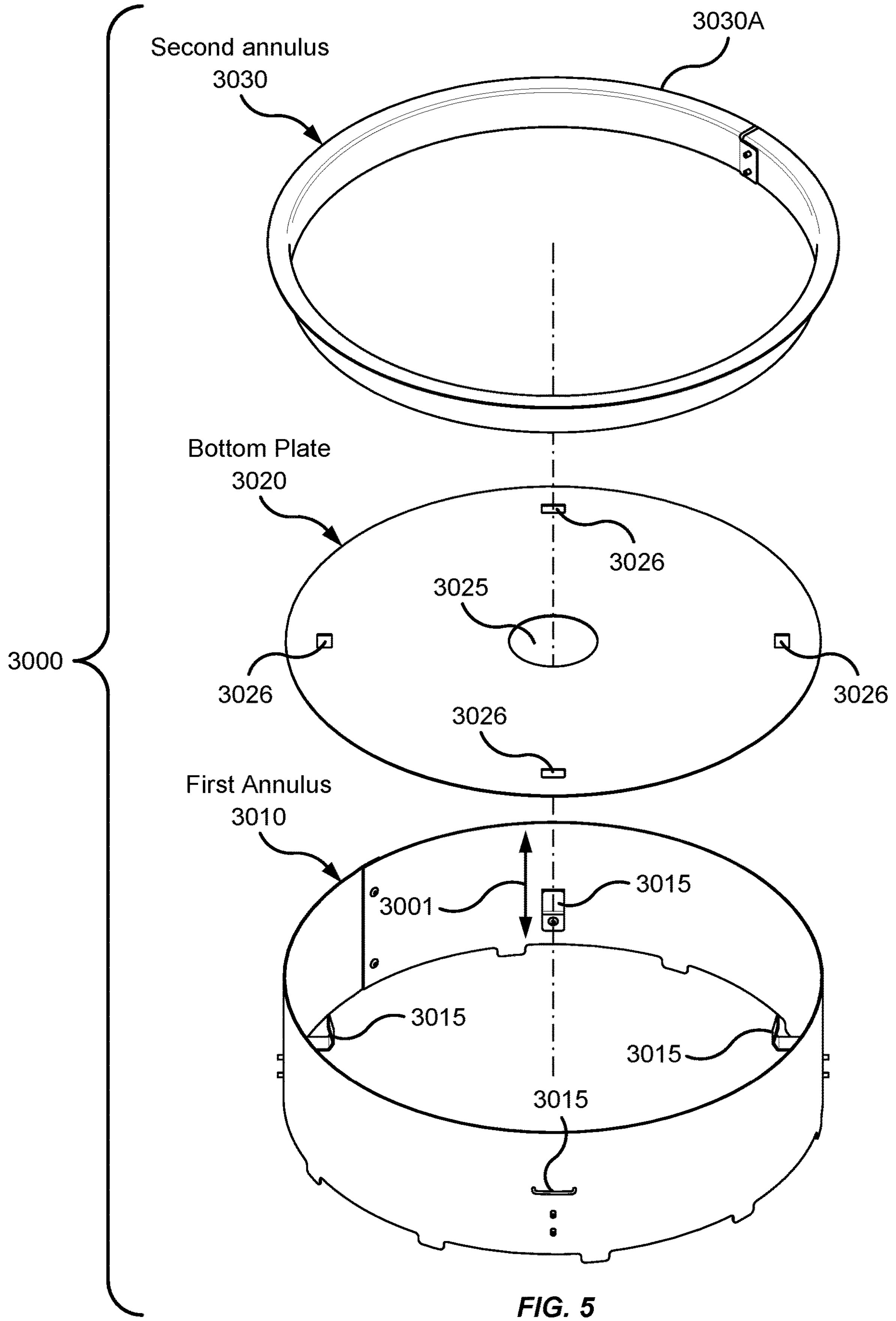
FIG. 5 shows an example of the fixture before assembling components of the fixture together.

FIG. 5 shows an example of the fixture 3000 before assembling the first annulus 3010, the bottom plate 3020, and the second annulus 3030 together (e.g., an exploded view of the fixture 3000). The bottom plate 3020 may be configured to be seated in the first annulus 3010, for example, as the plurality of holes 3026 in the bottom plate 3020 engage with respective tabs 3015 of the first annulus 3010. The length 3001 of the bottom plate 3020 relative to the first annulus 3010 may be established by the height of the tabs 3015 attached to an interior surface of the first annulus 3010. The length 3001 may be set to correspond to a length of a portion of the stem (not shown in FIG. 5, see stem 1002 of FIG. 2) that is desired to be coated. The stem 1002 of FIG. 2 may be registered with the center aperture 3025 of the bottom plate 3020. The second annulus 3030 may be configured to be seated in the first annulus 3010 and above the bottom plate 3020. The folded flange 3030A of the second annulus 3030 may be configured to hang over an edge of a top of a circumferential wall 2020 of the process chamber 2000, as shown in FIG. 3A. Additionally or alternatively, the folded flange 3030A may be configured to rest on an upper edge of the first annulus 3010.

Figure 6:
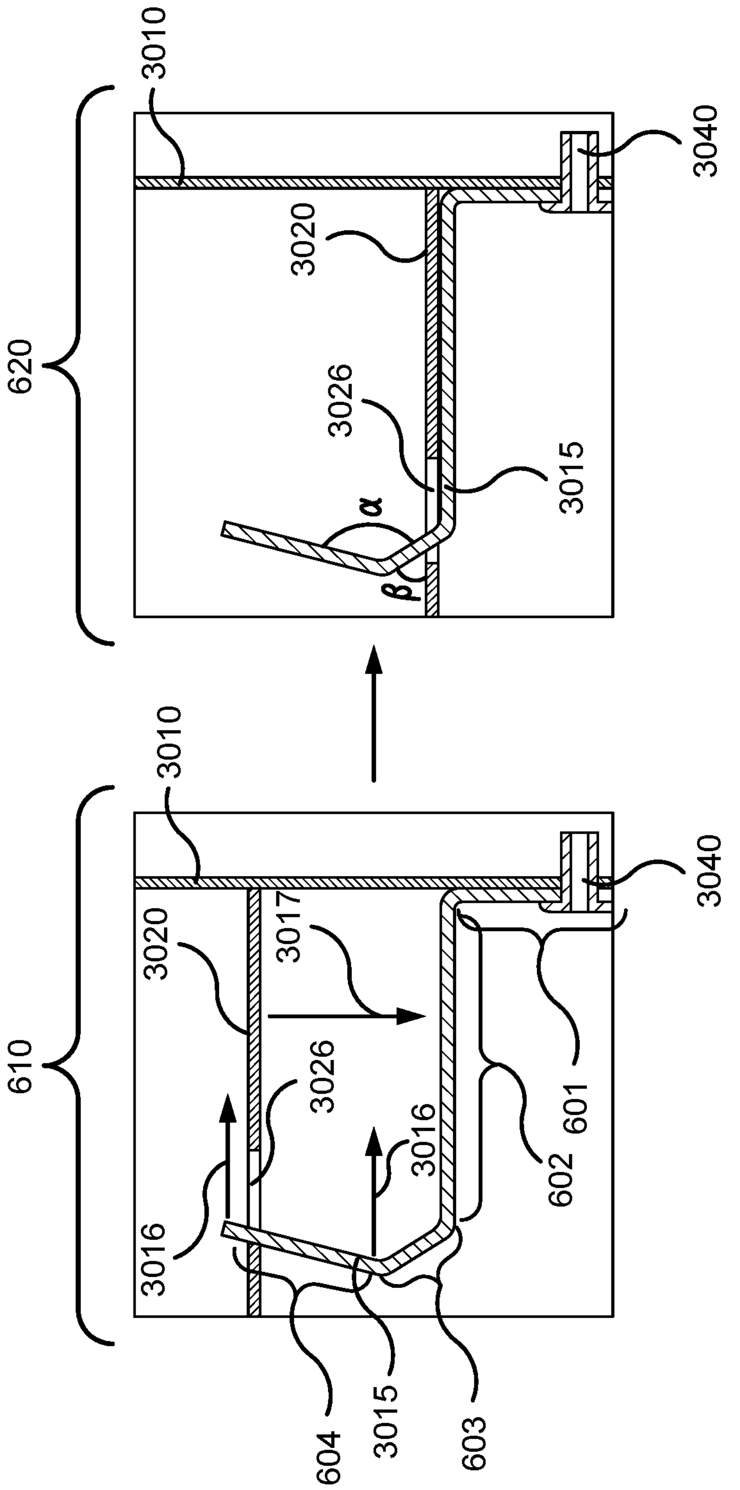
FIG. 6 shows a side view of the progression of seating the bottom plate on the tabs.

FIG. 6 shows an example of how the tabs 3015 may be configured to interact with the bottom plate 3020, for example, via the plurality of holes 3026. For simplicity, only one tab 3015 is shown in FIG. 6. FIG. 6 shows the first annulus 3010, the bottom plate 3020 with a hole 3026, and a tab 3015. The tab 3015 may be fixed to an inner side of the first annulus 3010, for example, by one or more rivets 3040 and/or welding the tab 3015 and the first annulus 3010 together. Fixing the tab 3015 to the cylindrical wall of the first annulus 3010 by one or more rivets 3040 may be advantageous over welding because welded components may likely develop cracks and eventually fail after prolonged exposure to high temperature.

An initial engagement of the tab 3015 and the bottom plate 3020 is shown on the left side 610 of FIG. 6. Here, the bottom plate 3020 is being pressed down against the tab 3015. For seating the bottom plate 3020 in the first annulus 3010, for example, the tab 3015 may exert a force toward inner walls of the first annulus 3010. The hole 3026 may be positioned relative to the tab 3015 to require an effort to seat the bottom plate 3020. Pressing bottom plate 3020 down in the direction of arrow 3017 onto tab 3015 may force the tab 3015 in the direction of arrow 3016. The tab 3015, as pressed down, may pass through a corresponding hole 3026 of the bottom plate 3020. After engagement, shown by the right side 620 of FIG. 6, the bottom plate 3020 is seated on the first annulus 3010.

As shown in FIG. 6, each tab 3015 may comprise four segments 601-604. A greater or fewer quantity of segments may be used as desired. A first segment 601 may be fastened, by a rivet 3040, to the cylindrical wall of the first annulus 3010. A second segment 602 may be angled (e.g., approximately 90°±10-20°) relative to the first segment 601 and extended inwardly from the cylindrical wall. A third segment 603 may be angled (e.g., approximately 60°±10-20° and shown by angle β) relative to the second segment 602 and extended inward toward a center of the first annulus 3010. A fourth segment 604 may be angled (e.g., approximately 135°±10-20° and shown by angle α) relative to the third segment 603 and extend back toward the cylindrical wall of the first annulus 3010. For example, a length of the fourth segment 604 may be more than twice a length of the third segment 603. For examples, an angle α between the third segment 603 and the fourth segment 604 may be 135° degrees and an angle β between the third segment 603 and the bottom plate 3020 seated on the third segment 603 may be 60° degrees. These angles are example of suitable values, and cooperate with material(s) and geometry of the fixture 3000 to facilitate manipulation of each tab 3015 with one or more hands.

The angles between the four segments 601-604 and lengths of the four segments 601-604 may be adjusted so that fastening the bottom plate 3020 to the tabs 3015 may be made easier than removing the bottom plate 3020 from the tabs 3015 after fastening. For example, installing the bottom plate 3020 may take a pair of hands of a single technician while uninstalling the bottom plate 3020 may take the hands of two or three technicians. For example, it may take two pairs of hands to keep pressing two pairs of tabs 3015 away in opposite direction of arrows 3016 while a fifth hand may be used to press the bottom plate 3020 upward in the opposite direction of arrow 3017. Such configuration of the tabs 3015 may be suitable for a permanent installation of the bottom plate 3020.

Additionally or alternatively, the tabs 3015 may include different types of tabs. For example, a first pair of the tabs 3015 may be configured to fasten, by a first mechanism, the bottom plate 3020 to the first pair of the tabs 3015 and a second pair of the tabs 3015 may be configured to fasten, by a second mechanism, the bottom plate 3020 to the second pair of the tabs 3015. Removing the bottom plate 3020, fastened by the second mechanism, from the second pair of the tabs 3015 may be made easier (e.g., by increasing the angle α or decreasing the angle β of the second pair of the tabs 3015) than removing the bottom plate 3020, fastened by the first mechanism, from the first pair of the tabs 3015. A pair of hands may be enough for uninstalling the bottom plate 3020. For example, a pair of hands may be used to keep pressing the first pair of the tabs 3015 away in opposite direction of arrows 3016 and pull up the bottom plate 3020 away from the second pair of the tabs 3015 for uninstalling. In this example, such configuration of the tabs 3015 may be suitable for a semi-permanent installation of the bottom plate 3020.

Figure 7:
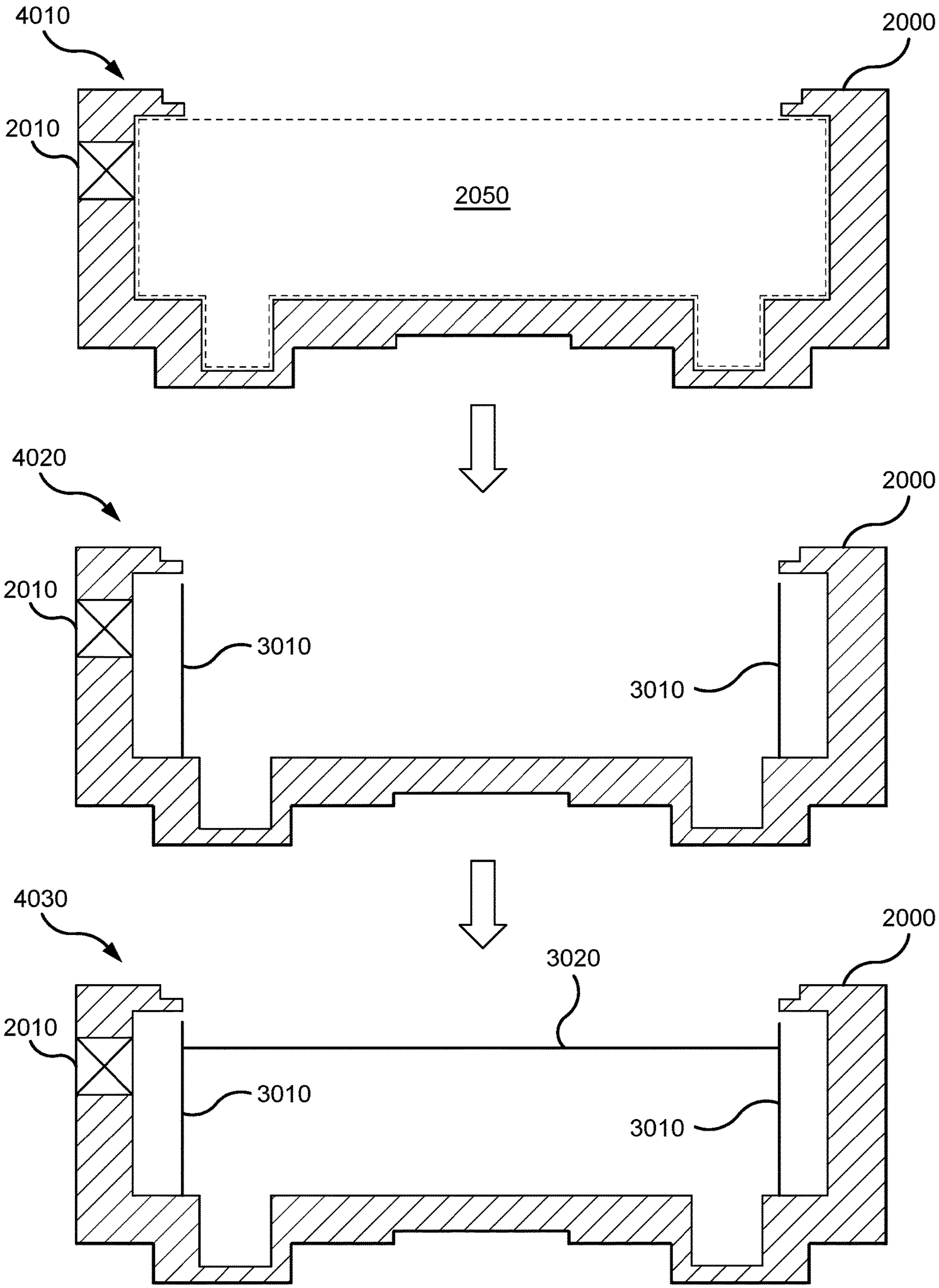
FIG. 7 shows a cross-sectional view of an example of installing a fixture in a process chamber.
Figure 8:
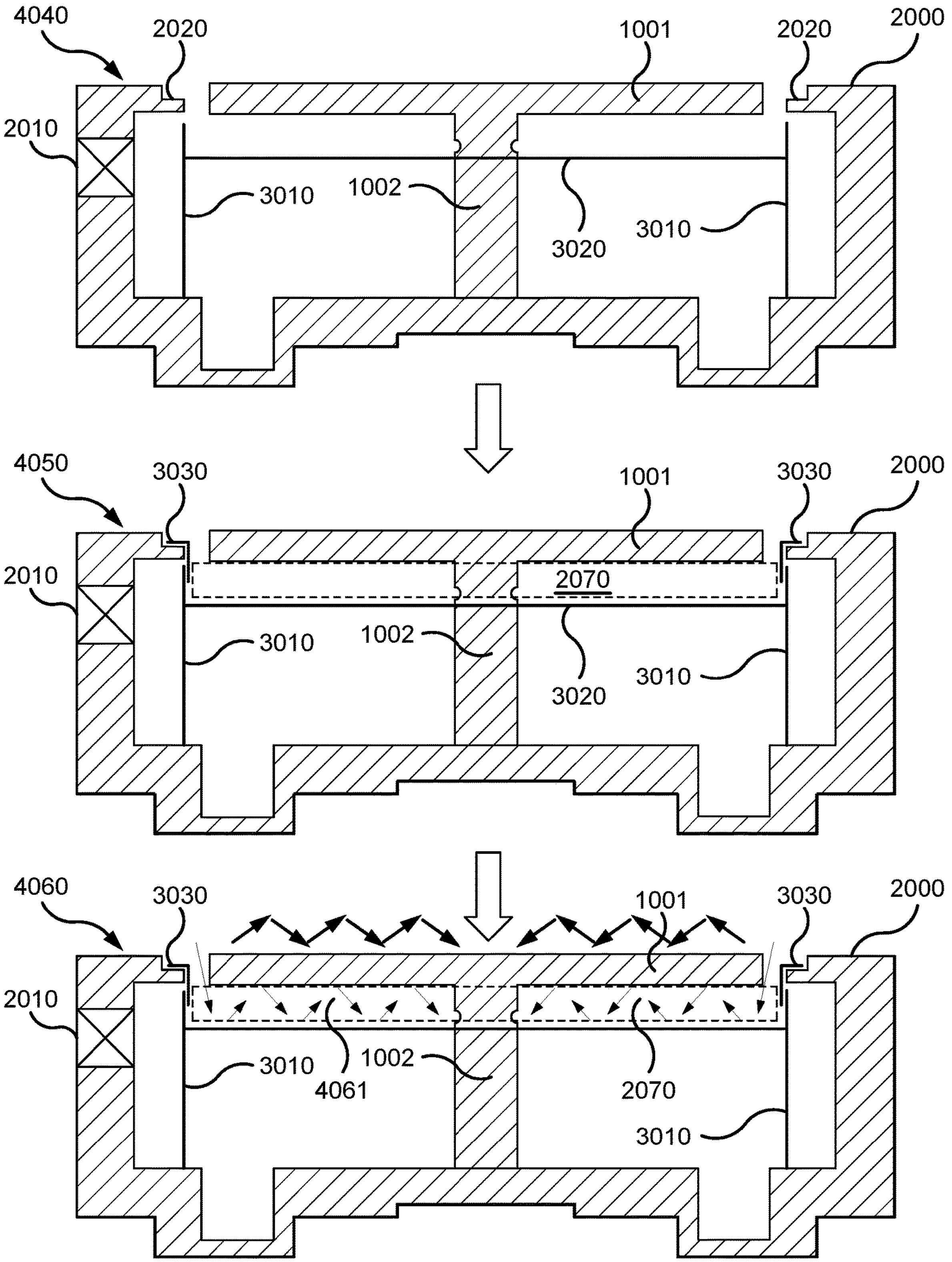
FIG. 8 shows a cross-sectional view of the example of installing the fixture in the process chamber of FIG. 7.

FIGS. 7 and 8 show cross-sectional views of various steps for installing fixtures in process chambers. At step 4010 of FIG. 7, some components (e.g., a pedestal, a ring, a shaft, etc., not shown) may be removed from the process chamber 2000 and the volume 2050 may be exposed. A gate valve 2010 is shown on the left of the process chamber 2000. At step 4020 of FIG. 7, the first annulus 3010 is seated in the process chamber 2000 and blocks the gate valve 2010. At step 4030 of FIG. 7, the bottom plate 3020 may be seated to the first annulus 3010. At step 4040 of FIG. 8, a workpiece (e.g., the heater 1001 and the stem 1002) may be placed in the process chamber 2000. The center aperture 3025 of the bottom plate 3020 may be registered with the stem 1002. At step 4050, the second annulus 3030 may be seated in the first annulus 3010 and above the bottom plate 3020. The folded flange of the second annulus 3030 may hang over the edge of a top of a circumferential wall 2020 of the process chamber 2000. The volume 2070 may be defined by inner walls of the process chamber 2000, the bottom plate 3020, the first annulus 3010, and the second annulus 3030. Further, the volume 2070 may be sealed (e.g., using a labyrinth seal) to prevent the precursor gas from flowing out of the volume 2070. At step 4060, the precursor gas 4061 flows into the volume 2070 for coating the heater 1001 and the portion of the stem 1002 within the volume 2070. Once the coating is completed, the heater 1001 and the stem 1002 may be removed from the process chamber 2000 and installed in the process chamber 1000 for use in various semiconductor processing steps.

Figure 9:
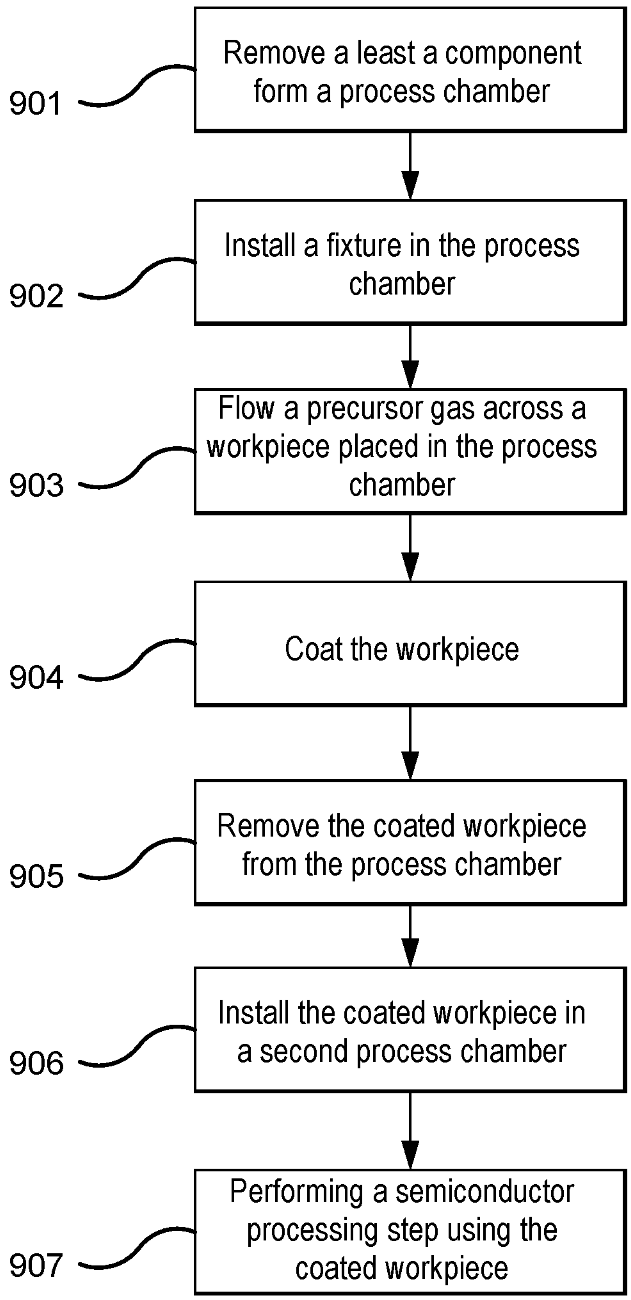
FIG. 9 shows an example of a flowchart describing a process for adjusting a volume of a process chamber.
Figure 9:
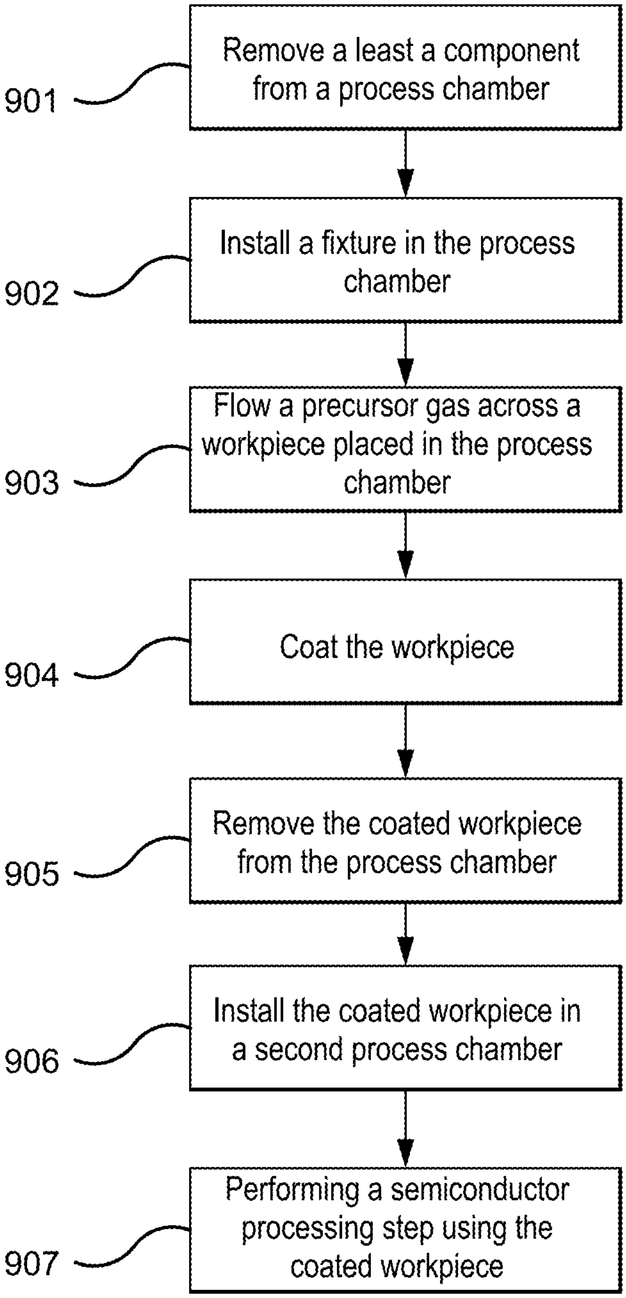

FIG. 9 shows an example of a flowchart showing steps for an example process chamber volume adjustment method for coating a workpiece. One, some, or all steps of the example process chamber volume adjustment method of FIG. 9 may be omitted, performed in other orders, and/or otherwise modified, and/or one or more additional steps may be added. At step 901, at least a component (e.g., a pedestal, a ring, a shaft, etc.), which may perform a function associated with a process chamber, may be removed from the process chamber. At step 902, a fixture may be installed in the process chamber by performing semiconductor processing steps (e.g., the steps described in FIG. 10). At step 903, at least a precursor gas may be controlled to flow across a workpiece (e.g., a heater, a stem, a showerhead, a pneumatic valve manifold, a gas channel plate, etc.). At step 904, the workpiece is coated with the molecules provided by the precursor gas. At step 905, the coated workpiece may be removed from the process chamber. At step 906, the coated workpiece may be installed in another process chamber. At step 907, the other process chamber with the coated workpiece may perform a semiconductor processing function associated with the other process chamber.

Figure 10:
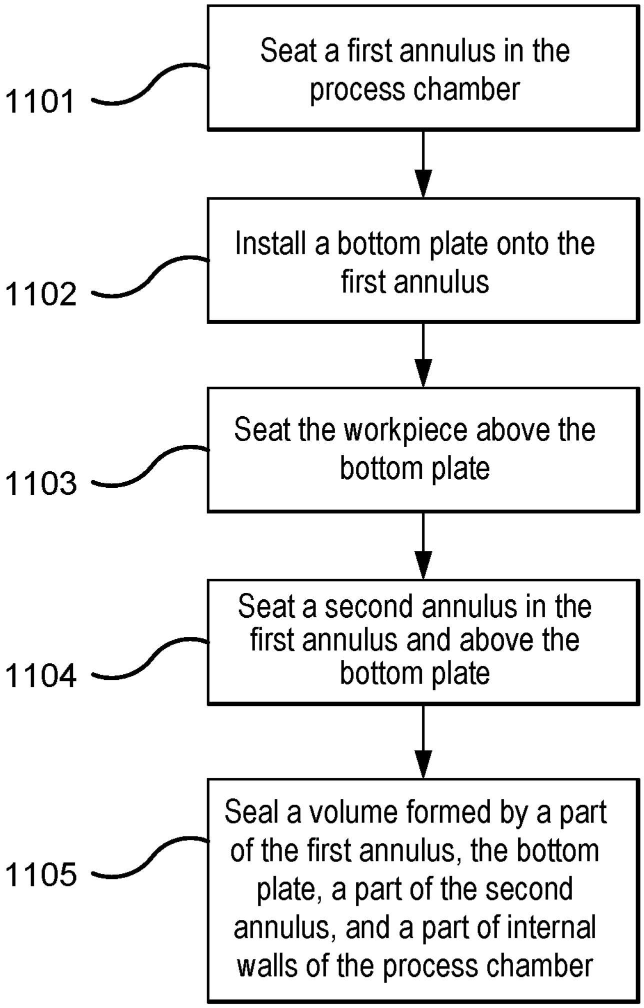
FIG. 10 shows an example of a flowchart describing a process for adjusting a volume of a process chamber.

FIG. 10 shows an example of a flowchart showing steps for an example fixture installation method for adjusting a process chamber volume. One, some, or all steps of the example process chamber volume adjustment method of FIG. 10 may be omitted, performed in other orders, and/or otherwise modified, and/or one or more additional steps may be added. At step 1101, a first annulus of the fixture is seated in the process chamber. At step 1102, a bottom plate of the fixture is seated in the first annulus. At step 1103, a workpiece is seated above the bottom plate and a part of the workpiece may be registered with a center aperture of the bottom plate. At step 1104, a second annulus of the fixture is seated in the first annulus and above the bottom plate. At step 1105, a volume, formed by a part of the first annulus, the bottom plate, a part of the second annulus, and a part of internal walls of the process chamber, may be sealed (e.g., using a labyrinth seal) to prevent flow of a precursor gas beyond the bottom plate.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
removing, from a process chamber comprising internal walls and at least one component, wherein the internal walls define a first volume, the at least one component;
installing, in the process chamber, a fixture, wherein the fixture and at least some of the internal walls define a second volume, wherein the second volume is smaller than the first volume;
inserting, into the process chamber with the second volume, a workpiece;
flowing, across the workpiece, a precursor gas;
coating, based on the precursor gas flowing across the workpiece, the workpiece as a coated workpiece; and
removing, based on the coating, the coated workpiece from the process chamber with the second volume.

2. The method of claim 1, further comprising:
installing, in a second process chamber for processing semiconductor substrates, the coated workpiece; and
performing at least one semiconductor processing step on the semiconductor substrates,
wherein the coated workpiece, installed in the second process chamber, is configured to perform a function associated with the at least one semiconductor processing step.

3. The method of claim 1, wherein the removing the at least one component comprises removing, from the process chamber, at least one of:
a substrate support and a shaft, or
a lift pin configured to lift the substrate support.

4. The method of claim 1, wherein the coating comprises coating, in the process chamber with the second volume:
a heater,
a showerhead,
a pneumatic valve manifold (PVM), or
a gas channel plate (GCP).

5. The method of claim 1,
wherein the inserting comprises seating the workpiece in the process chamber with the second volume, wherein at least a part of the workpiece is processed in the second volume, and
wherein the flowing comprises flowing the precursor gas through the process chamber with the second volume, bounded by the fixture and the at least some of the internal walls.

6. The method of claim 1, wherein the installing comprises sealing the fixture to restrict the precursor gas from flowing into a portion of the first volume not contained in the second volume.

7. The method of claim 1,
wherein the process chamber comprises an inside wall having a first circumference and a gate valve, in the inside wall, configured to permit passage of an object, and
wherein the installing the fixture comprises:
seating, in the process chamber, a first annulus of the fixture, wherein the first annulus, with a second circumference extends along the inside wall, wherein the gate valve is blocked by the first annulus;
installing, onto the first annulus, a bottom plate; and
seating, in the first annulus and above the bottom plate, a second annulus.

8. The method of claim 1,
wherein the process chamber comprises an inside wall having a first circumference and a gate valve, in the inside wall, configured to permit passage of an object,
wherein the fixture comprises an annulus having a second circumference, a center, at least one tab, at least one rivet attaching the at least one tab to the annulus, and a bottom plate, wherein a location of the at least one tab is based on dimensions of the workpiece, and
wherein the installing the fixture comprises:
seating, in the process chamber, the annulus, wherein the annulus extends along the inside wall; and
seating the bottom plate of the fixture on the at least one tab, fixed to the annulus, by pressing the bottom plate downward against the at least one tab, wherein the at least one tab passes through at least a corresponding hole of the bottom plate.

9. The method of claim 8,
wherein the seating the bottom plate comprises seating the bottom plate on the at least one tab, each tab comprising metal and comprising at least four segments, and
wherein the at least four segments comprise:
a first segment configured to be fastened, by a rivet, to the inside wall of the annulus;
a second segment angled relative to the first segment and extending inwardly to the center of the annulus;
a third segment angled relative to the second segment and extending inwardly toward the center of the annulus; and
a fourth segment angled relative to the third segment and extending outwardly away from the center of the annulus, wherein a length of the fourth segment is more than twice of a length of the third segment.

10. The method of claim 8,
wherein the seating the bottom plate comprises seating the bottom plate on at least two different types of tabs,
wherein a first type tab of the at least two different types of tabs is configured to fasten, by a first mechanism, the bottom plate to the first type tab,
wherein a second type tab of the at least two different types of tabs is configured to fasten, by a second mechanism, the bottom plate to the second type tab, and
wherein removal of the bottom plate, fastened by the second mechanism, from the second type tab is easier than removal of the bottom plate, fastened by the first mechanism, from the first type tab.

11. A method comprising:
removing, from a process chamber comprising internal walls and at least one component, wherein the internal walls define a first volume, the at least one component;

installing, in the process chamber, a fixture, wherein the fixture and at least some of the internal walls divide the first volume into a plurality of second volumes, wherein one of the plurality of second volumes is smaller than a sum of remaining ones of the plurality of second volumes;

performing a coating process using the one of the plurality of second volumes; and removing a product of the coating process from the process chamber.

12. The method of claim 11, further comprising installing the product of the coating process in another process chamber configured to operate with the product.

13. The method of claim 11, wherein the product comprises a heater plate and a heater stem configured to support the heater plate, wherein a tabbed annulus of the fixture, surrounded by an inside wall of the process chamber, extends circumferentially around the heater stem, wherein a flanged annulus of the fixture, partially surrounded by an inside wall of the tabbed annulus, extends circumferentially around a part of the heater stem and a part of the heater plate, and wherein the installing the fixture comprises:

seating the tabbed annulus in the process chamber;

seating a bottom plate of the fixture on at least one tab extending radially inward from the tabbed annulus, wherein a center aperture of the bottom plate is registered with the heater stem; and seating the flanged annulus in the tabbed annulus.

14. The method of claim 13, wherein the performing the coating process comprises:

flowing at least a coating precursor gas into the one of the plurality of second volumes; and coating, based on the at least the coating precursor gas, the heater plate and at least a part of the heater stem.

15. The method of claim 13, wherein the at least one tab is configured to clip into a hole of the bottom plate, wherein the seating the bottom plate comprises fastening the bottom plate to four tabs, and wherein each of the four tabs through a corresponding hole of the bottom plate, the fastening being easier than unfastening the bottom plate from the four tabs.

16. The method of claim 13, wherein the seating the bottom plate comprises adjusting, based on a length of the heater stem of the product, positions of the at least one tab.

* * * * *